United States Patent
Barnes

(10) Patent No.: US 10,791,657 B1
(45) Date of Patent: Sep. 29, 2020

(54) COMPOSITE AIRCRAFT STRUCTURES WITH DIVIDERS FOR SHIELDING AND PROTECTING CABLES AND WIRES

(71) Applicant: Aerion Intellectual Property Management Corporation, Palo Alto, CA (US)

(72) Inventor: Edward Barnes, Palo Alto, CA (US)

(73) Assignee: Aerion International Property Management Corporation, Palo Alto, CA (US)

( * ) Notice: Subject to any disclaimer, the term of this patent is extended or adjusted under 35 U.S.C. 154(b) by 0 days.

(21) Appl. No.: 16/844,369

(22) Filed: Apr. 9, 2020

(51) Int. Cl.
| | |
|---|---|
| *H05K 9/00* | (2006.01) |
| *B64C 1/18* | (2006.01) |
| *H02G 3/30* | (2006.01) |
| *H02G 3/04* | (2006.01) |
| *B64C 1/12* | (2006.01) |
| *B64C 1/00* | (2006.01) |
| *B64D 45/02* | (2006.01) |

(52) U.S. Cl.
CPC .............. *H05K 9/002* (2013.01); *B64C 1/00* (2013.01); *B64C 1/12* (2013.01); *B64C 1/18* (2013.01); *H02G 3/0406* (2013.01); *H02G 3/30* (2013.01); *H05K 9/0098* (2013.01); *B64C 2001/0072* (2013.01); *B64D 45/02* (2013.01)

(58) Field of Classification Search
CPC ......... B64C 1/18; H05K 9/002; H05K 9/0098
See application file for complete search history.

(56) References Cited

U.S. PATENT DOCUMENTS

| | | | |
|---|---|---|---|
| 6,743,976 B2* | 6/2004 | Motzigkeit | B64C 1/18 174/486 |
| 8,500,066 B2* | 8/2013 | Lewis | B64D 45/00 244/119 |
| 10,005,537 B2* | 6/2018 | Guering | B64C 1/18 |
| 2009/0184199 A1* | 7/2009 | Leisten | B64D 45/02 244/1 A |
| 2010/0126752 A1* | 5/2010 | Watanabe | H05K 9/0098 174/102 D |
| 2015/0061380 A1* | 3/2015 | Schomacker | B63B 17/00 307/9.1 |
| 2015/0145298 A1* | 5/2015 | Wottke | B60N 2/0725 297/243 |

(Continued)

*Primary Examiner* — Hung V Ngo
(74) *Attorney, Agent, or Firm* — Hovey Williams LLP

(57) ABSTRACT

Improved methods and devices for shielding electrical and electronic aircraft components and their associated cables and wires from cross-coupling and electrical and magnetic interference and dissipating excess heat from the electrical and electronic aircraft components and cables and wires. An aircraft structure formed primarily of composite materials includes an outer wall; an inner wall; and a plurality of spaced-apart dividers extending transversely from and integrally formed with the inner wall. The dividers define a series of spaced-apart channels that are each partially enclosed by adjacent pairs of the dividers. A layer of electrically conductive foil covers the dividers and the channels to create a current return network in the channels. Wires and cables may be placed in the channels between adjacent pairs of the dividers to reduce cross-coupling between the wires and cables and shield the wires and cables from electromagnetic fields.

20 Claims, 6 Drawing Sheets

(56) References Cited

U.S. PATENT DOCUMENTS

| | | | |
|---|---|---|---|
| 2016/0009361 A1* | 1/2016 | Roborel De Climens | ................... B64C 1/18 244/120 |
| 2016/0129986 A1* | 5/2016 | Anast | ...................... B64C 1/069 244/119 |
| 2016/0207636 A1* | 7/2016 | Yokoi | .................. H05K 9/0003 |
| 2017/0370469 A1* | 12/2017 | Roborel De Climens | ................... B64D 45/02 |
| 2020/0056726 A1* | 2/2020 | Loss | ...................... H02G 3/263 |
| 2020/0086967 A1* | 3/2020 | Tiryaki | ..................... B64C 1/20 |

* cited by examiner

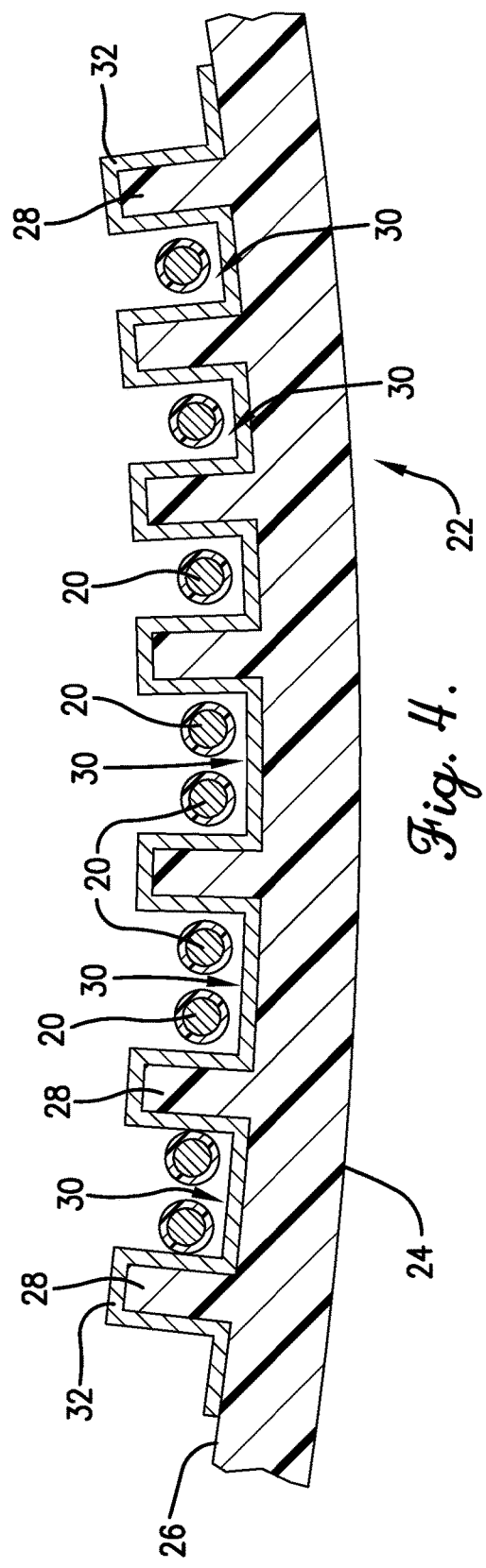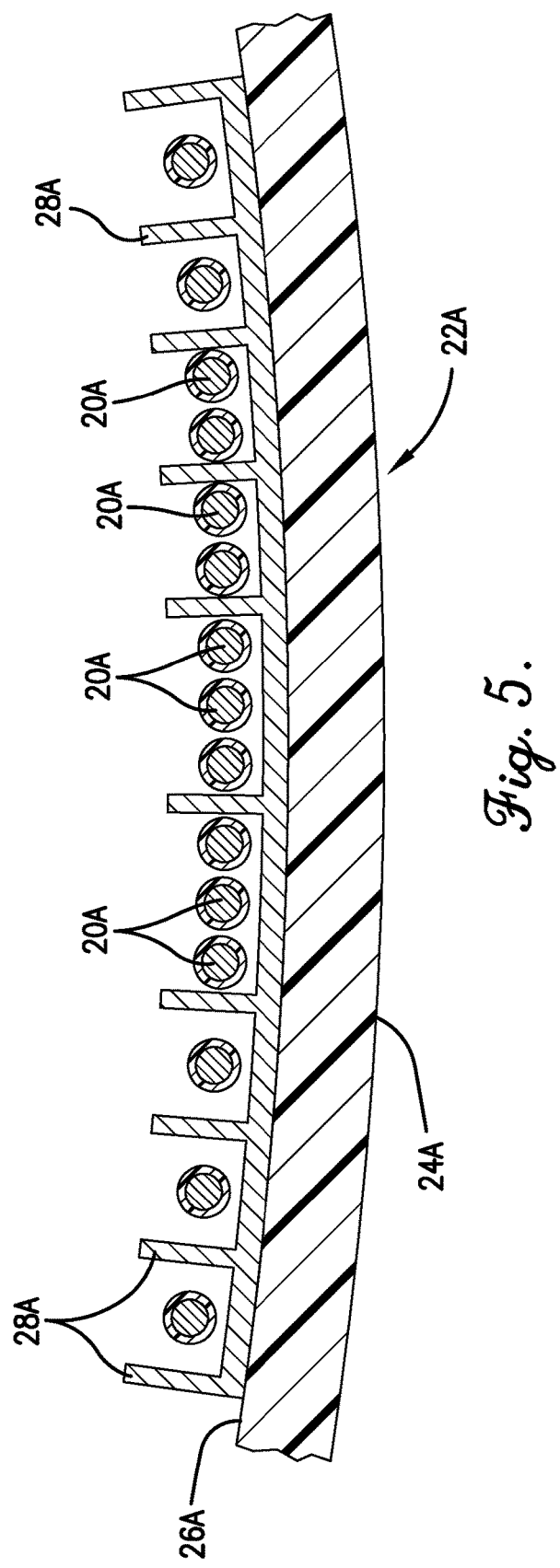

COMPOSITE AIRCRAFT STRUCTURES WITH DIVIDERS FOR SHIELDING AND PROTECTING CABLES AND WIRES

BACKGROUND

Modern aircraft contain numerous sensors, motors, actuators, instruments, displays and related electrical and electronic components and thousands of power cables and data and signaling wires for powering the components and exchanging data and signals between them. These electrical and electronic components and their associated cables and wires are subject to interference from cross-coupling and induced electrical and magnetic fields from other cables and wires and electrical and electronic components. The cables and wires are also occasionally subject to more severe interference from transient electrical and magnetic fields caused by lightning strikes, high intensity radiated fields, solar flares, electromagnetic pulses, and other electromagnetic phenomena.

These electrical and electronic components and their associated cables and wires also generate excess heat, that if not properly dissipated, can degrade the performance of the components and interfere with proper data and signal communications. This is especially true when the components are mounted in areas with poor ventilation and/or the cables and wires are strung through areas alongside heating ducts and other heat-generating mechanisms.

Aircraft with highly conductive aluminum fuselages, floors, and other structures help shield against and conduct away stray electrical and magnetic fields and protect against lightning strikes, high intensity radiated fields, solar flares, electromagnetic pulses and other electromagnetic phenomena. Aluminum-skinned aircraft also help conduct away excess heat from electrical and electronic components, cables and wires. But modern aircraft with fuselages and other major components built primarily of lightweight and less conductive composite materials do not adequately shield against cross-coupling and stray electromagnetic fields and do not readily conduct away heat.

To help shield electrical and electronic components, cables, and wires from electrical and magnetic interference in aircraft formed primarily from composite materials and to help dissipate excess heat, conductive cables, metal rods, and electrically conductive brackets may be placed near internal wiring and cabling to create heat radiation paths and internal current return paths for grounding and shielding. Unfortunately, these components add undesired weight to an aircraft, thus reducing the aircraft's efficiency and range, and take up valuable space within the aircraft.

SUMMARY

The present invention solves at least some of the above-described problems and other problems by providing improved methods and devices for shielding aircraft cables and wires from electrical and magnetic interference and dissipating excess heat from the electrical and electronic aircraft components and their associated cables and wires. Embodiments of the invention are particularly beneficial in aircraft with fuselages and other components formed primarily from composite materials.

An embodiment of the invention is an aircraft structure formed primarily of composite materials. The aircraft structure may be any structure against which wires and cables are installed such as a fuselage panel, a portion of a floor, an exterior surface of an internal fuel tank, etc.

The aircraft structure comprises an outer wall; an inner wall; and a plurality of spaced-apart dividers integrally formed with and extending transversely from either the inner wall or the outer wall. The dividers define a series of spaced-apart channels that are each partially enclosed by adjacent pairs of the dividers. The aircraft structure further comprises a layer of electrically conductive foil covering the dividers and the channels. The electrically conductive foil is preferably in the form of wide planar sheets of expanded copper metal foil.

The electrically conductive foil is connected to conductive foil or other conductors in other aircraft structures to create an internal current return network in the channels and throughout other areas and surfaces of the aircraft. Wires and cables may be placed in the channels between adjacent pairs of the dividers to reduce cross-coupling between the wires and cables and shield the wires and cables from electromagnetic fields. The dividers and channels also serve as protective raceways to physically protect the cables and wires from cuts, scrapes and other damage that may interfere with power, data, and signal propagation.

The dividers permit separation of wires and cables by signal type according to whether the wires and cables are considered victim cables that carry critical information or interference source cables. For example, victim cables can be routed in some of the channels and interference cables can be routed in separate channels.

In some embodiments, the dividers are spaced at least 5 centimeters apart so the channels are each at least 5 centimeters wide to accommodate several wires or cables in each channel. In some embodiments, the dividers are spaced varying distances apart so at least some of the channels have different widths than other channels so some of the channels can accommodate relatively larger diameter power cables and other channels can accommodate relatively smaller diameter data and signal wires.

The internal current return network formed in the channels and elsewhere in the aircraft provides a low impedance path that reduces electromagnetic interference and provides a continuous zero voltage reference plane. The dividers, channels, and electrically conductive foil also help conduct heat away from the cables and wires and radiate the heat elsewhere in the aircraft.

Constructing an internal current return network with dividers and channels covered in wide planes of expanded metal foil rather than with metal rods, cables or brackets significantly increases the surface area of the current return network for a given weight. Increasing the surface area allows the internal current return network to more effectively and efficiently reduce cross-coupling between the wires and cables and shield the wires and cables from electromagnetic fields while reducing aircraft weight.

Aircraft structures constructed as described above are preferably installed in all areas or zones of an aircraft where cables and wires are routed. For example, a number of fuselage panels may be constructed as described above and then installed in a line from the front of the aircraft to the back to create a continuous cable and wire raceway in the aircraft. In other embodiments, the aircraft structures may be integrated on the exterior surfaces of internal fuel tanks.

Another embodiment of the invention is a method of forming an aircraft structure such as a fuselage panel, a portion of a floor, or the exterior of a composite internal fuel tank. The method comprises forming an outer wall and inner wall of the aircraft structure primarily of composite materials. The method further comprises integrally forming a plurality of spaced-apart dividers on the outer wall or the inner wall such that the dividers extend transversely from the outer wall or the inner wall and define a series of spaced-apart channels. The method further comprises applying a layer of electrically conductive foil over the dividers and the channels to create an internal current return network in the channels. Finally, the method comprises installing wires and cables in the channels between adjacent pairs of the dividers.

An aircraft structure constructed in accordance with another embodiment of the invention is similar to the aircraft structure described above, the main difference being the materials used to form the dividers. Instead of being integrally formed of composite material with the inner or outer wall, the dividers are formed of electrically conductive foil. This eliminates the need to cover the dividers and channels with conductive foil.

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 4 is a fragmentary vertical sectional view of an aircraft structure constructed in accordance with an embodiment of the invention.

FIG. 5 is a fragmentary vertical sectional view of an aircraft structure constructed in accordance with another embodiment of the invention.

Figure 1:
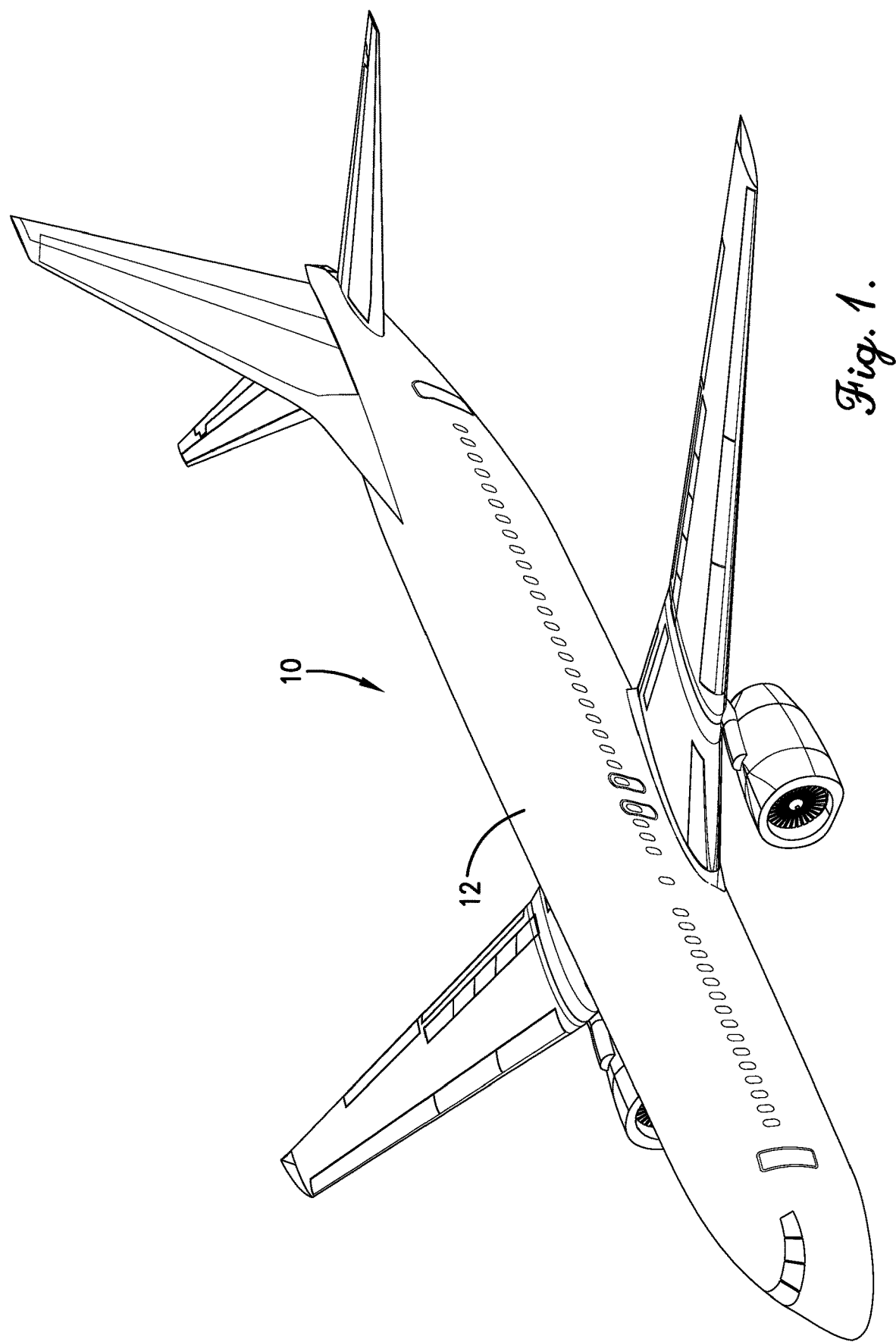
FIG. 1 is an isometric view of an exemplary aircraft in which embodiments of the present invention may be incorporated.

The drawing figures do not limit the present invention to the specific embodiments disclosed and described herein. The drawings are not necessarily to scale, emphasis instead being placed upon clearly illustrating the principles of the invention.

DETAILED DESCRIPTION

The present invention provides improved methods and devices for shielding electrical and electronic aircraft components and their associated cables and wires from electrical and magnetic interference and for dissipating excess heat from the electrical and electronic aircraft components.

Turning now to the drawing figures, and initially FIG. 1, an exemplary aircraft 10 in which aircraft structures constructed in accordance with embodiments of the invention may be installed is shown. The aircraft may be any size and type of aircraft. As used throughout this application, the term "aircraft" includes any commercial jet, business jet, personal jet, airplane, helicopter, flying car, rocket, missile, drone or other vehicle capable of becoming airborne.

Figure 2:
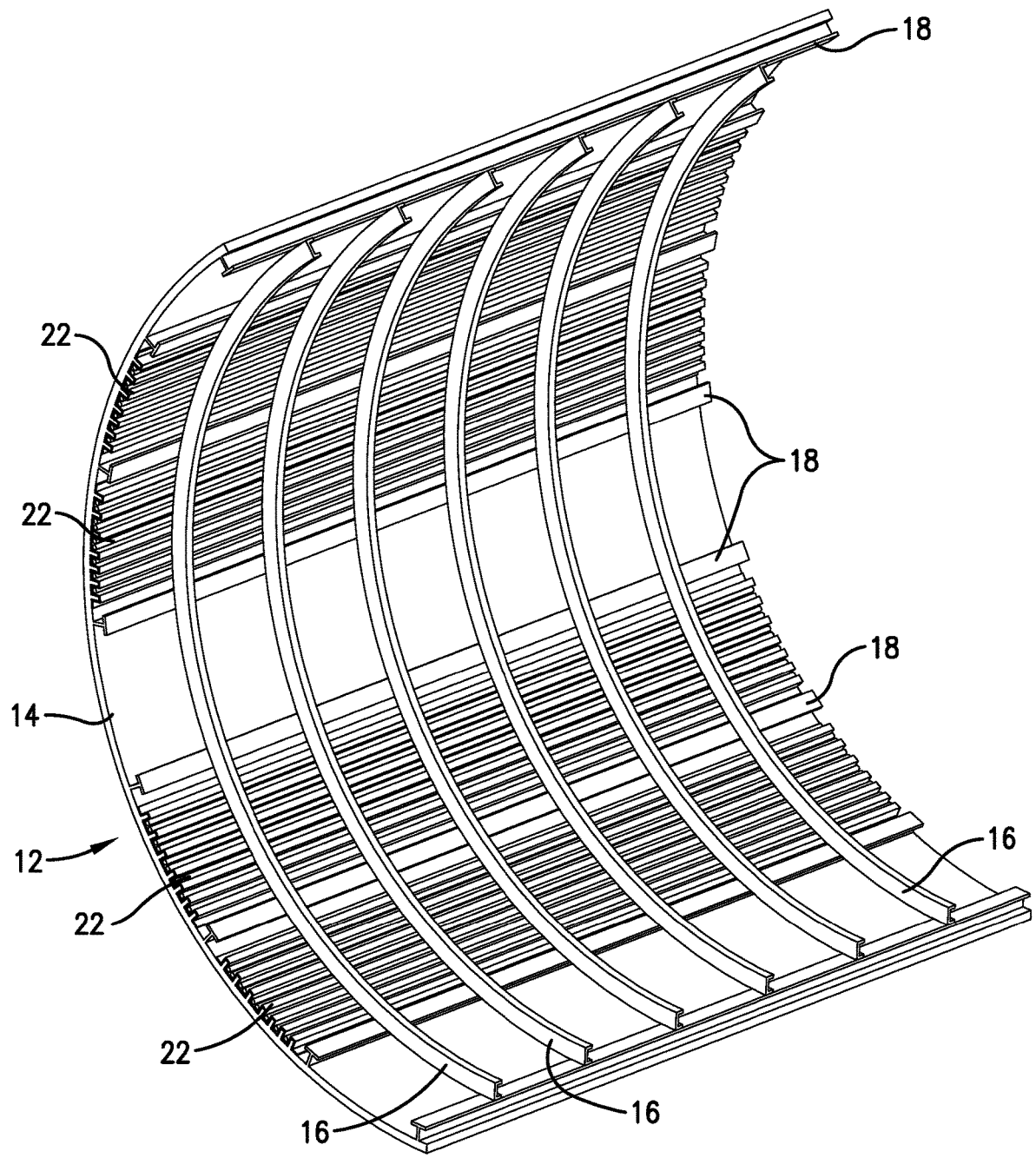
FIG. 2 is an isometric view of a portion of the fuselage of the aircraft in FIG. 1 showing aircraft structures constructed in accordance with embodiments of the invention.
Figure 3:
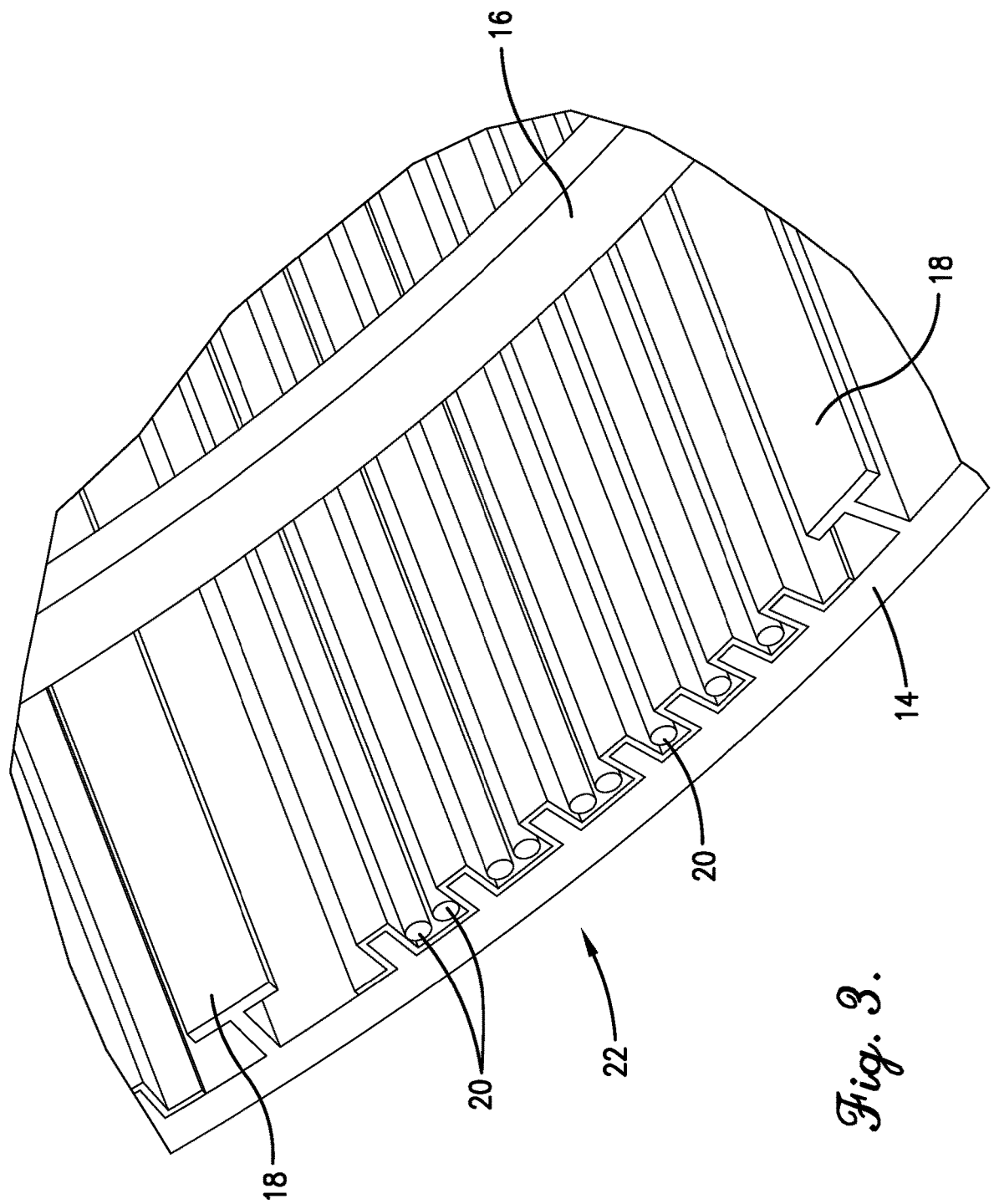
FIG. 3 is an enlarged fragmentary view of the aircraft structures shown in FIG. 2.

As best shown in FIGS. 1 and 2, the aircraft has a fuselage 12 formed at least partially of composite panels 14 attached to frames 16, stringers 18, and/or other structural components. The aircraft also has one or more internal fuel tanks. The aircraft further includes sensors, motors, actuators, instruments, displays and related electrical and electronic components and hundreds of power cables and data and signaling wires 20 for powering the components and exchanging data and signals between them. As best shown in FIG. 3, the power cables and data and signal wires 20 run along interior surfaces of the fuselage 12 and elsewhere inside the fuselage.

An aircraft structure 22 constructed in accordance with an embodiment of the invention is shown in FIG. 2-5. The aircraft structure 22 is formed primarily of composite materials and may be any structure against which wires and cables are installed. In some embodiments, the aircraft structure is a fuselage panel, a portion of a floor, or an exterior surface of an internal fuel tank.

The illustrated aircraft structure 22 is a fuselage panel that is attached to the frames 16, stringers 18, and/or other structural components along with other fuselage panels to form the aircraft's fuselage 12. However, the aircraft structure may be implemented elsewhere in the aircraft such as on the exterior surfaces of interior fuel tanks. As best illustrated in FIG. 4, the aircraft structure 22 comprises an outer wall 24; an inner wall 26; and a plurality of spaced-apart dividers 28 extending transversely from and integrally formed with either the inner wall or the outer wall. When the aircraft structure is used as a fuselage panel, the dividers 28 extend transversely from the inner wall 26 so they protrude into the interior of the fuselage.

Figure 6:
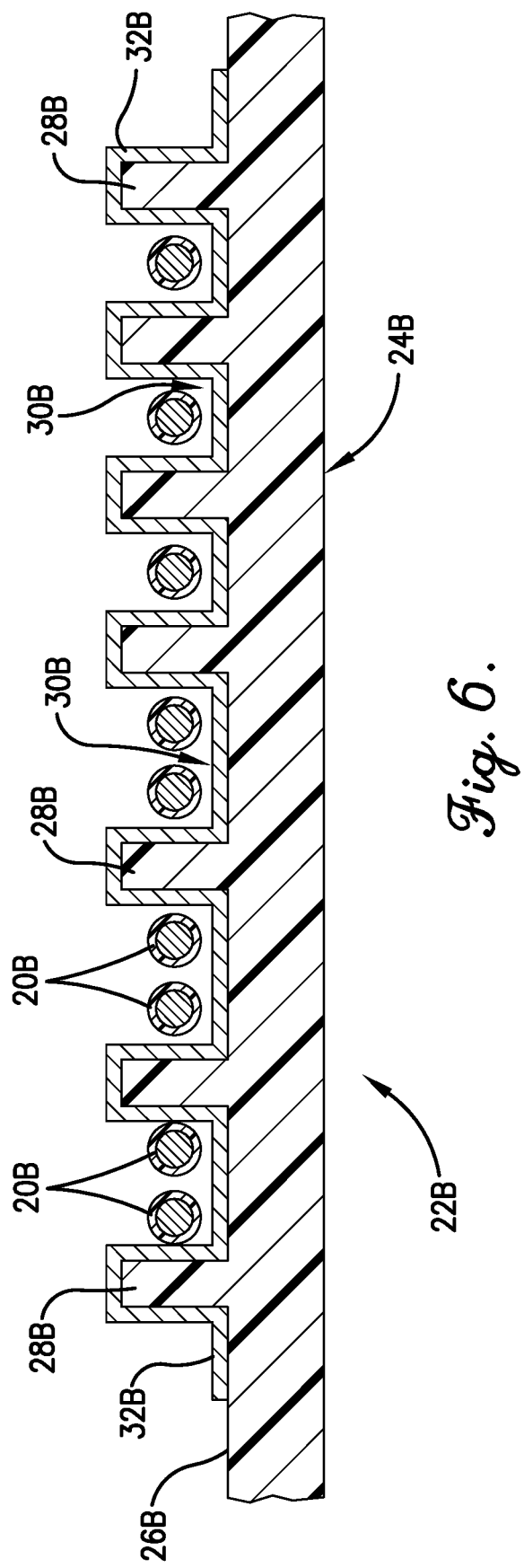
FIG. 6 is a fragmentary vertical sectional view of an aircraft structure constructed in accordance with another embodiment of the invention.
Figure 7:
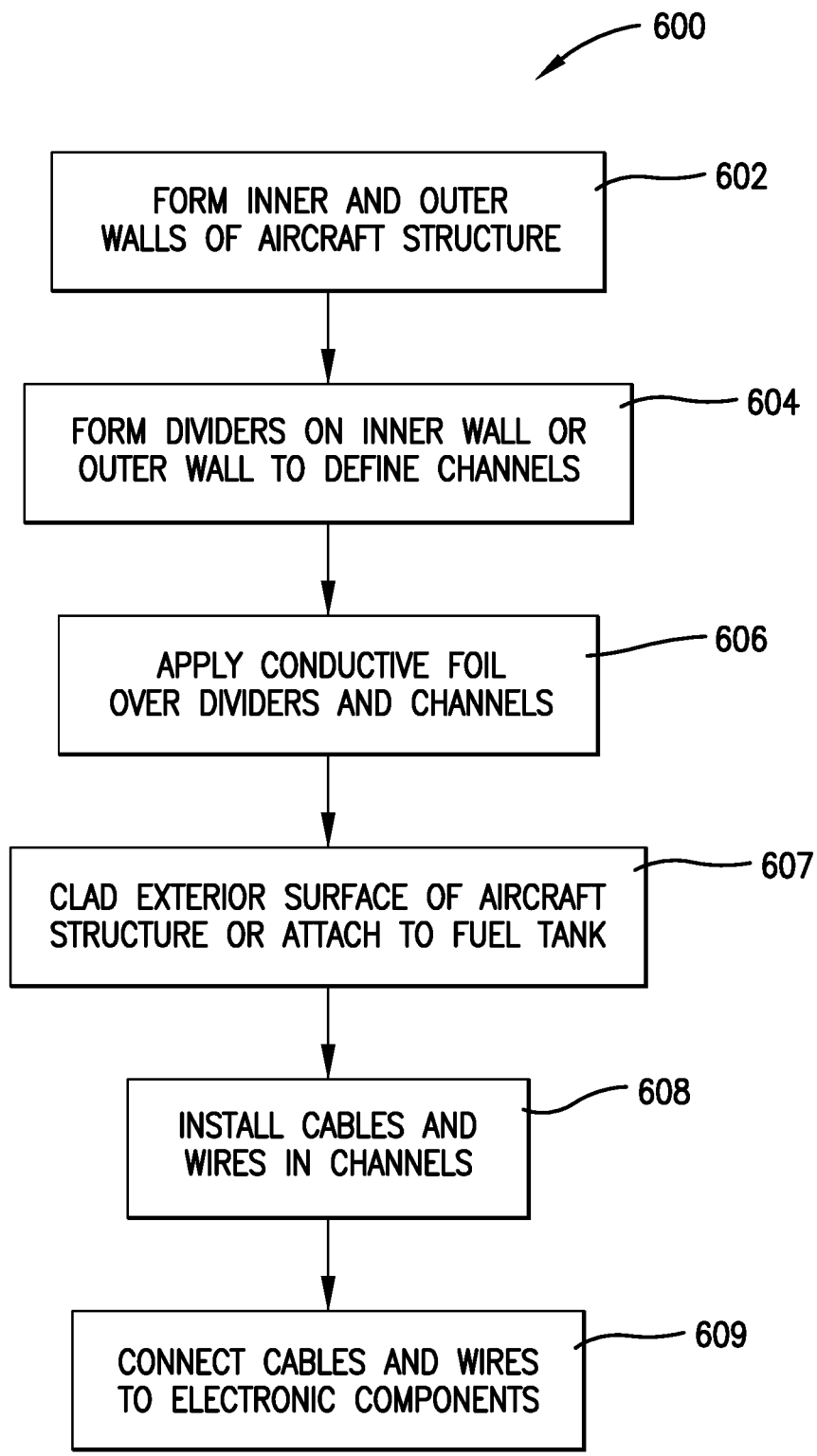
FIG. 7 is a flow diagram depicting exemplary steps in a method of the present invention.

FIGS. 2-5 illustrate the aircraft structure 22 as a fuselage panel attached to stringers on the exterior of the aircraft. This implementation of the invention requires at least ½" or more clearance for cables and wires from the exterior of the aircraft to prevent lightning punch through voltage. Another potentially more preferred implementation of an aircraft structure 22B is shown in FIG. 6 and described below. This implementation s above and below the exterior of fuel tanks inside the fuselage. Other implementations would be just above and along the passenger compartment ceiling and just below and along the passenger floor. The aircraft structure 22 could also be implemented in aircraft wings in aircraft with composite spars and ribs in the wings.

The dividers 28 define a series of spaced-apart channels 30 that are each partially enclosed by adjacent pairs of the dividers. The aircraft structure 22 further comprises a layer of electrically conductive foil 32 covering the dividers 28 and the floors of the channels 30 to create an internal current return network in the channels.

Wires and cables 20 may be placed in the channels 30 between adjacent pairs of the dividers to reduce cross-coupling between the wires and cables, shield the wires and cables from electromagnetic fields, and protect the wires and cables from physical damage.

The dividers permit separation of wires and cables by signal type according to whether the wires and cables are considered victim cables that carry critical information or interference source cables. For example, victim cables can be routed in some of the channels and interference cables can be routed in separate channels.

In some embodiments, the dividers 28 are spaced at least 5 centimeters apart so the channels 30 are each at least 5 centimeters wide to accommodate several wires or cables 20 in each channel. In some embodiments, the dividers may be spaced varying distances apart as shown in FIG. 4 so at least some of the channels have different widths than other of the channels. This permits some of the channels to accommodate relatively larger diameter power cables and other channels can accommodate relatively smaller diameter data and signal wires.

The dividers 28 each extend approximately 5-10 centimeters from the inner wall 26 and are each at least 2 centimeters wide. The dividers may be of varying width so that some are wider than others. Wider dividers create channels with enhanced electromagnetic isolation and shielding for power cables that carry higher currents and/or voltages.

The conductive foil material applied over the dividers and channels is in the form of wide planar sheets, and in one embodiment, is formed of expanded copper foil such as Dexmet expanded metal foil 3CU7-100A. The exemplary metal foil is formed of annealed copper with 7 mils strand width and 5 mils thickness. The expanded mesh is approximately 0.127 mm thick, has an open area of 70%, and a weight of 195.3 grams/m². The conductive foil material may also be formed of other thin, wide plane, highly conductive materials.

The internal current return network formed in the channels 30 provides a low impedance path directly on the aircraft structure 22. The internal current return network reduces electromagnetic interference with power, data, and signal cables and provides a continuous zero voltage reference plane. The internal current return network also minimizes the voltage drop between circuits, components, and line replaceable units that require bonding to a zero-volt reference. The internal current return network also reduces voltage drops for 115 VAC and 28 VDC power systems in the aircraft, ensures stray currents will trip circuit break protection components quickly, provides a low resistance path between exposed metal parts and structure to prevent personnel shock hazards, provides a low impedance return current path for intended and unintended common mode signals to reduce radiated emissions and improve radio frequency and transient susceptibility, provides appropriate zero-volt reference for transmit and receive antennas, and provides adequate bonding for static discharge considerations. The dividers, channels, and electrically conductive foil also help conduct heat away from the cables and wires and radiate the heat elsewhere in the aircraft.

Constructing an internal current return network with dividers 28 and channels 30 covered in wide planes of expanded metal foil 32 rather than with metal rods, cables or brackets significantly increases the surface area of the current return network for a given weight. Increasing the surface area allows the internal current return network to more effectively and efficiently reduce cross-coupling between the wires and cables and shield the wires and cables from electromagnetic fields while reducing aircraft weight. The dividers 28 and channels 30 also serve as protective raceways to physically protect the cables and wires from cuts, scrapes and other damage that may interfere with power, data, and signal propagation.

Aircraft structures constructed as described above are preferably installed in all areas or zones of an aircraft where cables and wires are routed. For example, as partially illustrated in FIG. 2, a series of fuselage panels may be constructed as described above and then installed in lines from the front of the aircraft to the back to create semi-continuous cable and wire raceways in the aircraft.

Routing the cables and wires in an internal current return network reduces the loop area where both high intensity radiated fields (HIRF) and lightning induced magnetic and electric fields couple onto the cables. It also narrows the dispersion of the return current path beneath the cable resulting in reduced crosstalk on the return plane.

The internal current return network created in the aircraft structure 22 is connected to other current return networks in the aircraft including an external current return network in as many locations as possible. With such connections, the internal current return network provides a parallel current path for lightning strikes while providing a low impedance return current path for wires and cables routed from front to back of the fuselage.

Another embodiment of the invention is a method 600 of forming an aircraft structure such as a fuselage panel, a portion of a floor, or the exterior of a composite internal fuel tank. The flow chart of FIG. 6 shows exemplary steps in an embodiment of the method. In some alternative implementations, the steeps or functions noted in the various blocks may occur out of the order depicted in FIG. 6. For example, two blocks shown in succession in FIG. 6 may in fact be executed substantially concurrently, or the blocks may sometimes be executed in the reverse order depending upon the functionality involved.

The method 600 comprises forming an aircraft structure 22 such as a fuselage panel primarily out of composite materials. The aircraft structure comprises an outer wall and inner wall as depicted in step 602. The method further comprises integrally forming a plurality of spaced-apart dividers on the outer wall or the inner wall as depicted in step 604. When the aircraft structure is a fuselage panel, the dividers extend from the inner wall of the panel. The dividers are formed to extend transversely from the outer wall and the inner wall and define a series of spaced-apart channels. The method further comprises applying a layer of electrically conductive foil over the dividers and the channels as depicted in step 606. This creates an internal current return network in the channels. Finally, the method comprises installing wires and cables in the channels between adjacent pairs of the dividers as depicted in step 608. The internal current return network reduces cross-coupling between the wires and cables and shields the wires and cables from electromagnetic fields. In other embodiments, the method may further comprise cladding an exterior surface of an aircraft with the aircraft structure 22 and/or attaching the aircraft structure to the exterior surface of a fuel tank inside the aircraft as depicted in step 607. The method may also comprise connecting the cables and/or wires to electronic components in the aircraft as depicted in step 609.

An aircraft structure 22A constructed in accordance with another embodiment of the invention is shown in FIG. 5. The aircraft structure is similar to the aircraft structure 22 described above, so similar components are identified with the same numerals followed by "A". The main difference in the aircraft structure 22A is the materials used to form the dividers 28A. Instead of being integrally formed of composite material with the inner or outer wall, the dividers 28A of the aircraft structure 22A are formed of electrically conductive foil. This eliminates the need to cover the dividers and channels with conductive foil.

An aircraft structure 22B constructed in accordance with yet another embodiment of the invention is shown in FIG. 6. The aircraft structure 22B is similar to the aircraft structure 22 described above, so similar components are identified with the same numerals followed by "B". The main difference in the aircraft structure 22B is its intended use. Rather than being embodied in an aircraft fuselage panel, the aircraft structure 22B is integrally formed with the upper or lower exterior surface of an internal fuel tank. The aircraft structure 22B may also be implemented just above and along a passenger compartment ceiling and/or just below and along a passenger compartment floor. In most of these embodiments, the outer wall 24B and inner wall 26B are planar rather than being curved as are the walls 24 and 26 of the aircraft structure 22.

Additional Considerations

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the current technology can include a variety of combinations and/or integrations of the embodiments described herein.

Although the present application sets forth a detailed description of numerous different embodiments, the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An aircraft structure formed primarily of composite materials and comprising:
    an outer wall;
    an inner wall;
    a plurality of spaced-apart dividers extending transversely from and integrally formed with the inner wall, the dividers defining a series of spaced-apart, partially enclosed channels each with an open top;
    a layer of electrically conductive foil covering the dividers and the channels to create an internal current return network in the channels; and
    wires and cables placed in the open top channels between adjacent pairs of the dividers so the wires and cables touch the layer of electrically conductive foil but are not wrapped in the electrically conductive foil to permit the wires and cables to be placed in the channels without disrupting the electrically conductive foil.

2. The aircraft structure of claim 1, the dividers each extending approximately 5-10 centimeters from the inner wall.

3. The aircraft structure of claim 1, the dividers each being at least 2 centimeters wide.

4. The aircraft structure of claim 1, wherein the dividers are spaced at least 5 centimeters apart so that the channels are each at least 5 centimeters wide.

5. The aircraft structure of claim 1, wherein the dividers are spaced varying distances apart so that at least some of the channels have different widths than other of the channels.

6. The aircraft structure of claim 1, wherein the dividers are of varying widths.

7. The aircraft structure of claim 1, wherein the aircraft structure is configured to clad an exterior surface of an aircraft or be integrally formed on an exterior surface of an internal aircraft fuel tank.

8. The aircraft structure of claim 1, wherein the aircraft structure is a portion of a floor of an aircraft.

9. An aircraft fuselage panel formed primarily of composite materials and comprising:
    an outer wall;
    an inner wall;
    a plurality of spaced-apart dividers extending transversely from the inner wall, the dividers defining a series of spaced-apart and partially enclosed channels with open tops, the dividers formed of electrically conductive foil to create an internal current return network in the channels; and
    wires and cables placed in the open top channels between adjacent pairs of the dividers so the wires and cables touch the layer of electrically conductive foil but are not wrapped in the electrically conductive foil to permit the wires and cables to be placed in the channels without disrupting the electrically conductive foil over the dividers and the channels.

10. The aircraft fuselage panel of claim 9, the dividers each extending approximately 5-10 centimeters from the inner wall.

11. The aircraft fuselage panel of claim 9, the dividers each being at least 1 centimeter wide.

12. The aircraft fuselage panel of claim 9, wherein the dividers are spaced at least 5 centimeters apart so that the channels are each at least 5 centimeters wide.

13. The aircraft fuselage panel of claim 9, wherein the dividers are spaced varying distances apart so that at least some of the channels are have different widths than other of the channels.

14. A method of forming an aircraft structure, the method comprising:
   forming an outer wall and inner wall of the aircraft structure primarily of composite materials;
   integrally forming a plurality of spaced-apart dividers on the inner wall, the dividers extending transversely from the inner wall and defining a series of spaced-apart and partially enclosed channels with open tops;
   applying a layer of electrically conductive foil over the dividers and the channels to create an internal current return network in the channels; and
   installing wires and cables in the channels by inserting them through the open tops in the channels between adjacent pairs of the dividers to reduce cross-coupling between the wires and cables and shield the wires and cables from electromagnetic fields without wrapping the wires and cables in the electrically conductive foil.

15. The method of claim 14, further comprising the step of forming the dividers so they each extend approximately 5-10 centimeters from the inner wall.

16. The method of claim 14, further comprising the step of forming the dividers so they are each at least 2 centimeters wide.

17. The method of claim 14, further comprising the step of forming the dividers at least 5 centimeters apart so that the channels are each at least 5 centimeters wide.

18. The method of claim 14, further comprising the step of forming the dividers varying distances apart so the channels have different widths.

19. The method of claim 14, further comprising connecting the wires and cables to electronic components in an aircraft.

20. The method of claim 14, further comprising attaching the aircraft structure to an exterior surface of an aircraft or integrally forming the aircraft structure as an exterior surface of an internal aircraft fuel tank.

* * * * *